(12) United States Patent
Li et al.

(10) Patent No.: US 10,680,099 B2
(45) Date of Patent: Jun. 9, 2020

(54) ISOLATED LATERALLY DIFFUSED METAL OXIDE SEMICONDUCTOR (LDMOS) TRANSISTOR HAVING LOW DRAIN TO BODY CAPACITANCE

(71) Applicant: GLOBALFOUNDRIES Singapore Pte. Ltd., Singapore (SG)

(72) Inventors: Liming Li, Singapore (SG); Shaoqiang Zhang, Singapore (SG); Ruchil Kumar Jain, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/898,669

(22) Filed: Feb. 19, 2018

(65) Prior Publication Data
US 2019/0259875 A1  Aug. 22, 2019

(51) Int. Cl.
| | |
|---|---|
| *H01L 29/78* | (2006.01) |
| *H01L 21/761* | (2006.01) |
| *H01L 21/8238* | (2006.01) |
| *H01L 27/06* | (2006.01) |
| *H01L 29/49* | (2006.01) |
| *H01L 29/66* | (2006.01) |
| *H01L 29/08* | (2006.01) |
| *H01L 29/10* | (2006.01) |

(52) U.S. Cl.
CPC ........ *H01L 29/7816* (2013.01); *H01L 21/761* (2013.01); *H01L 21/823814* (2013.01); *H01L 21/823878* (2013.01); *H01L 21/823892* (2013.01); *H01L 27/0629* (2013.01); *H01L 29/0847* (2013.01); *H01L 29/1095* (2013.01); *H01L 29/4933* (2013.01); *H01L 29/6659* (2013.01); *H01L 29/66659* (2013.01); *H01L 29/66689* (2013.01); *H01L 29/7833* (2013.01)

(58) Field of Classification Search
None
See application file for complete search history.

(56) References Cited

U.S. PATENT DOCUMENTS

| | | | | |
|---|---|---|---|---|
| 2007/0045767 | A1* | 3/2007 | Zhu | H01L 23/3677 257/505 |
| 2007/0267693 | A1* | 11/2007 | Chien | H01L 21/823892 257/343 |
| 2011/0127602 | A1* | 6/2011 | Mallikarjunaswamy | H01L 21/823807 257/331 |

* cited by examiner

*Primary Examiner* — Ali Naraghi
(74) *Attorney, Agent, or Firm* — Thompson Hine LLP

(57) ABSTRACT

A transistor, such as laterally diffused (LD) transistor, having a band region below a drift well is disclosed. The band region and drift well are oppositely doped. The band region is self-aligned to the drift well. The band region reduces the depth of the drift well. A shallower drift well reduces risk of punch-through, improving reliability. In addition, the shallower drift well reduces the drain to body parasitic capacitance which improves performance.

13 Claims, 10 Drawing Sheets

ISOLATED LATERALLY DIFFUSED METAL OXIDE SEMICONDUCTOR (LDMOS) TRANSISTOR HAVING LOW DRAIN TO BODY CAPACITANCE

FIELD OF THE INVENTION

The present disclosure generally relates to isolated laterally diffused metal oxide semiconductor (LDMOS) transistors. More particularly, the transistors include a band region under the drift region to improve reliability and performance.

BACKGROUND

Laterally diffused (LD) transistors, such as laterally diffused metal-oxide-semiconductor (LDMOS) transistors, are widely employed in high voltage applications, including power management applications. To provide flexibility in terminal connections and shielding the impact from surrounding devices, isolation is needed. Conventional techniques to isolate LDMOS employ two deep isolation wells of opposite polarity type. For example, in the case of a n-type LDMOS, an additional deep p-type isolation well is employed in addition to the deep n-type isolation well. The additional p-type isolation well is shallower than the deep n-type isolation well. The use of two deep isolation wells requires an additional mask, undesirably increasing cost. Furthermore, the additional p-type isolation well is restricted by the depth of the n-type isolation well.

In addition, conventional LDMOS transistors have deep drift regions to improve drain voltage endurance. However, deep drift regions restrict channel dimension shrinkage, as well as increasing junction capacitance due to the high dopant dosage required. This negatively impacts scalability and performance.

The present disclosure is directed to a scalable LDMOS with low junction capacitance to improve performance.

SUMMARY

Embodiments generally relate to semiconductor devices and methods for forming a device. In one embodiment, a device is disclosed. The device includes a substrate with a device region, a gate having first and second gate sidewalls disposed on a top surface of the substrate in the device region, a first source/drain (S/D) region disposed adjacent to the first gate sidewall and a second S/D region disposed adjacent to the second gate sidewall. The device also includes a device well disposed in the substrate in the device region, the device well has a device well depth and encompasses the first S/D region and extends partially under the gate from the first gate sidewall. The device also includes a drift well disposed in the device region, the drift well encompasses the second S/D region and extends under the gate and abuts the device well, and that the drift well has a drift well depth which is shallower than the device well depth. The device further includes a self-aligned band region disposed below the drift well to a band region depth which is equal to about the device well depth.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to high power devices. For example, high voltage or high power devices include laterally diffused (LD) transistors, such as laterally diffused metal oxide semiconductor (LDMOS) transistors. The high power devices can be employed as switching voltage regulators for power management applications. The LD transistors can be easily integrated into devices or ICs. The devices or ICs can be incorporated into or used with, for example, consumer products. Other types of products may also incorporate the devices.

Figure 1A:
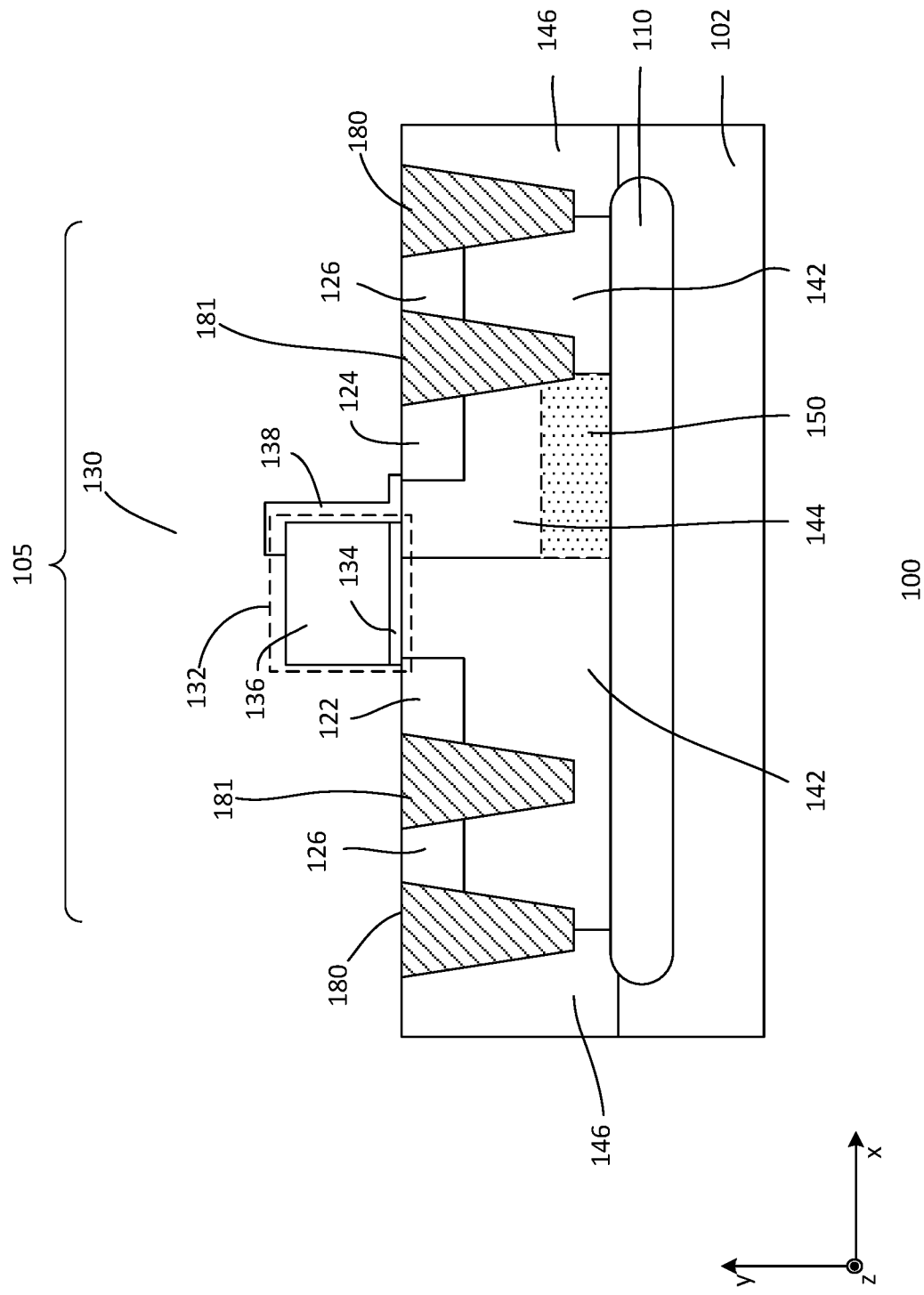
FIGS. 1a-1b show simplified cross-sectional views of embodiments of a device.
Figure 1B:
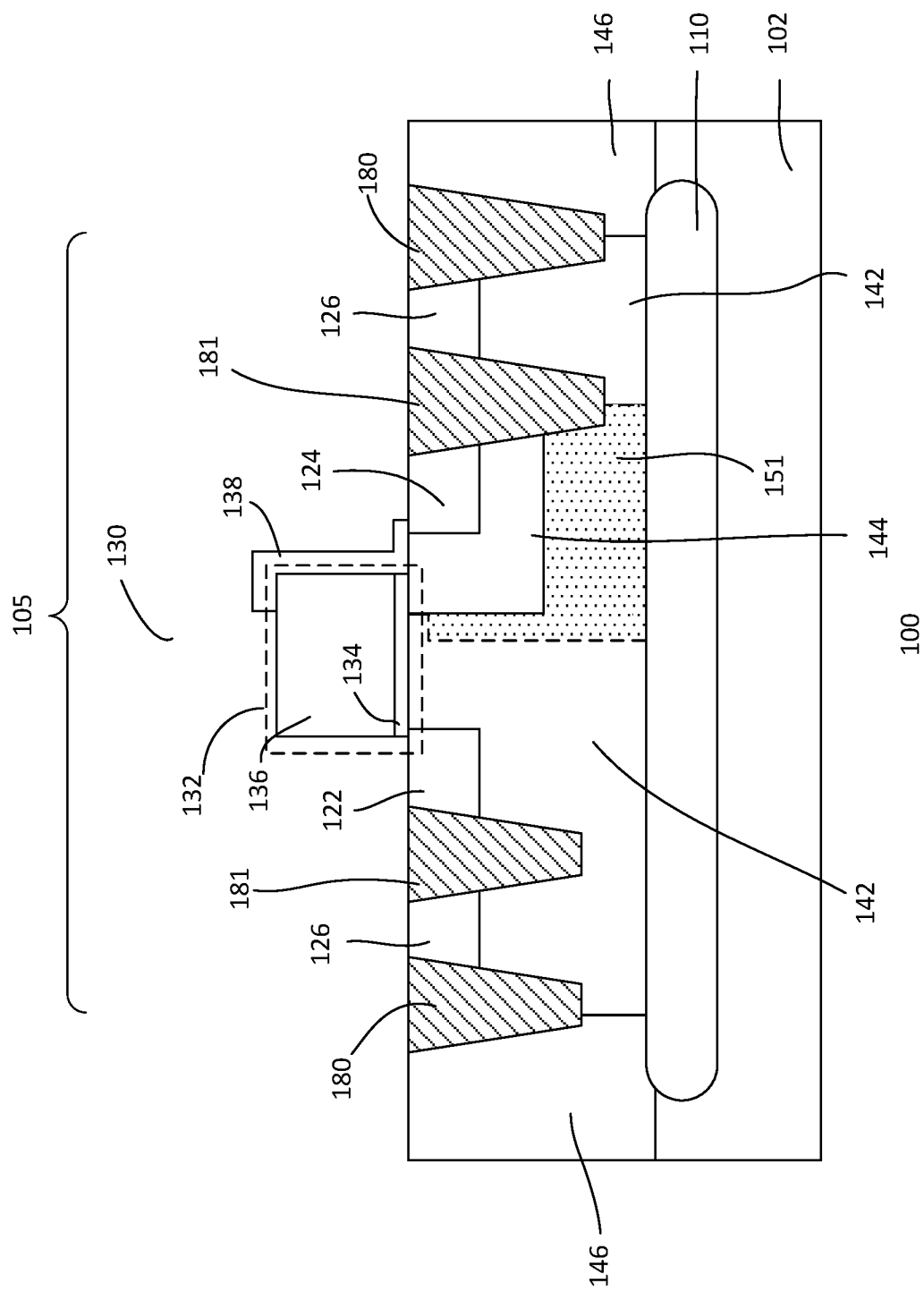

FIGS. 1a-1b show cross-sectional views of embodiments of a device 100. The device, for example, is an IC. Other types of devices may also be useful. As shown, the device includes a substrate 102. The substrate, for example, is a silicon substrate. Other types of substrates, such as silicon germanium (SiGe), germanium (Ge), gallium arsenide (GaAs). The substrate may be a doped substrate. For example, the substrate can be lightly doped with p-type dopants. Providing a substrate with other types of dopants or dopant concentrations, as well as an undoped substrate, may also be useful.

The device may include doped regions having different dopant concentrations. For example, the device may include heavily doped ($x^+$), intermediately doped (x) and lightly doped ($x^-$) regions, where x is the polarity type which can be n or p. A lightly doped region may have a dopant concentration of about 1E11-1E13 atoms/cm$^3$, and an intermediately doped region may have a dopant concentration of about 1E13-1E15 atoms/cm$^3$, and a heavily doped region may have a dopant concentration of about 1E15-1E17 atoms/cm$^3$. Providing other dopant concentrations for the different types of doped regions may also be useful. For example, the ranges may be varied, depending on the technology node. P-type dopants may include boron (B), aluminum (Al), indium (In), or a combination thereof, while n-type dopants may include phosphorous (P), arsenic (As), antimony (Sb), or a combination thereof.

The substrate includes a device region 105. The device region, for example, is a high voltage (HV) device region for a HV device, such as a HV transistor. In one embodiment, a LDMOS transistor 130 is disposed in the device region. Providing other types of devices in the device region may also be useful. The device region may be a rectangular shaped device region. For example, the surface area of the device region 105 may be rectangular. Other geometrically shaped device regions may also be useful. The substrate may also include regions for other types of circuit components, depending on the type of device or IC. For example, the device may also include regions for intermediate voltage (IV) and low voltage (LV) devices, as well as an array region for memory devices.

Isolation regions may be provided for isolating or separating different device regions of the substrate. In one embodiment, a device isolation region 180 is provided to isolate the device region 105. For example, the device isolation region surrounds the device region. The device region may be an active region of the device. In one embodiment, the device region may be provided with one or more internal isolation regions 181 to form active sub-regions. In one embodiment, an internal isolation region 181 may surround the device region within the device isolation region 180. This forms a guard ring region between the isolation regions. The guard ring region, for example, surrounds the internal device region within the internal isolation region. In another embodiment, internal isolation regions are disposed within the source side and drain side of the device isolation region. The internal device isolation regions each extends a width (z-direction) of the device region. Other configurations of device and internal isolation regions may also be useful.

The device and internal isolation regions may be shallow trench isolation (STI) regions. A STI region includes an isolation trench filled with isolation or dielectric materials. Other types of isolation regions may also be employed. The STI regions, for example, extend to a depth of about 3000 Å from the surface of the substrate. Providing isolation regions which extend to other depths may also be useful.

The device region includes a device well 142. The device well may also be referred to as a body well. The device well, for example, is a doped well with second polarity type dopants. The device well serves as a body for a first polarity type transistor. For example, in the case of a n-type transistor, the device well is a p-type well. The device well may be an intermediately doped well with second polarity type dopants. For example, the device well has a dopant concentration of about 1E13-1E15 atoms/cm$^3$. Other dopant concentrations may also be useful. The device well has a depth below the trench isolation regions. The depth of the device well, for example, may be about 1 Other depths may also be useful.

In one embodiment, the device is an isolated device. To isolate the device, a doped device isolation well is provided in the substrate, surrounding or encompassing the device well. The device isolation well isolates the device well from the substrate. In one embodiment, the device isolation well includes side device isolation and deep device isolation wells 146 and 110. The device isolation wells, in one embodiment, are first polarity type doped wells. For example, the wells are n-type doped wells. The side and deep device isolation wells encompass the device well, isolating it from the substrate. For example, the side device isolation well surrounds the device isolation region and extends at least the same depth as the device well. As for the deep device isolation well, it is disposed below the device well and extends under the side device isolation well. The deep device isolation well, for example, may be a buried isolation layer. The depth of the buried isolation layer, for example, is from the bottom of the device well to about 1.5 μm. Other depths for the buried isolation layer may also be useful.

As discussed, the side device isolation well and buried isolation layer encompass the device well and the device isolation region, fully isolating the device region from the substrate and other device regions. The substrate within the side device isolation well and buried isolation layer may be referred to as the isolated device region. In one embodiment, the side device isolation well and buried isolation layer are doped with first polarity type dopants to isolate the second polarity type device well from the substrate. The dopant concentration of the side device isolation well and buried isolation layer may be about 1E11-1E13 atoms/cm$^3$. Other dopant concentrations may also be useful.

The transistor 130 includes a gate 132. The gate, in one embodiment, includes a gate electrode 136 over a gate dielectric 134. The gate dielectric, for example, may be silicon oxide while the gate electrode may be polysilicon. The thicknesses of the gate dielectric and gate electrode are determined by the device requirements, for example, breakdown voltage, operating voltage and other operating parameters. In some embodiments, the gate electrode may be a doped electrode. For example, the gate electrode may be polysilicon doped with first polarity type dopants. Providing polysilicon doped with second polarity type dopants for the gate electrode may also be useful. Other types of gate dielectrics and gate electrodes, as well as thicknesses may also be useful. For example, the gate dielectric may be a high k gate dielectric and the gate electrode may be a metal gate electrode. Other configurations of gate layers of the gate may also be useful. The gate traverses the device region along the channel length (x) direction. For example, the gate is disposed along the channel width (z) direction. The x-direction and z-directions, for example, are orthogonal directions.

First and second source/drain (S/D) regions 122 and 124 are disposed adjacent to first and second sides of the gate. The S/D regions are heavily doped first polarity type regions for a first polarity type device. For example, the S/D regions are heavily doped n-type S/D regions for a n-type transistor. Providing p-type heavily doped S/D regions for a p-type device may also be useful. The dopant concentration of the S/D regions may be about 1E15-1E17 atoms/cm$^3$. Other dopant concentrations for the first and second S/D regions may also be useful. The first S/D region may be a source region and the second S/D region may be a drain region.

In other embodiments, extension regions (not shown) may be formed in the substrate. For example, an extension region may be formed at the first or source side of the gate after gate formation. For example, a lightly doped (LD) extension region may be formed in the substrate adjacent to the source side of the gate after forming the polysilicon of the gate electrode. The LD extension region may be lightly doped with the same polarity dopants as the first and second S/D regions.

In other embodiments, gate sidewall spacers (not shown) may also be formed on the sidewalls of the gate. For example, gate sidewall spacers may be formed with anisotropic and/or dielectric etch. After forming the gate sidewall spacers. The process continues with implantation of first and second S/D regions.

As shown, the S/D regions are disposed within internal device trench isolation regions 181. For example, the internal trench isolation regions extend the width of the device region along the z-direction. A S/D region is disposed in the substrate between the gate and the internal trench isolation region. The S/D regions extend from the surface of the substrate to a depth which is shallower than the trench isolation regions. The depth of the S/D regions may be, for example, about 150 Å. Other depths may also be useful.

The device region may include a device body well contact 126. The device body well contact, in one embodiment, is disposed in the guard ring region between the device and internal trench isolation regions 180 and 181. The device body well contact may be heavily doped second polarity type contact regions. The contact region may be similar to the S/D regions, except that the contact region and S/D regions are oppositely doped. As shown, the device body well contact is separated from the S/D regions by the internal isolation region. In some embodiments, the well contact and the first S/D or source region are butted. For example, the well contact and first S/D region are disposed adjacent and abuts each other. In the case that the well contact and first S/D region are butted, no internal isolation region is provided to separate them. As for the second S/D or drain region, the body well contact is isolated by the internal isolation region. Providing a well contact and a first S/D region which are butted facilitates a more compact transistor. In other embodiments, the body well does not surround the drain or second S/D region. In such case, no internal isolation region is needed to isolate the drain region from the well contact as there is no well contact disposed adjacent to the drain region. For example, no internal isolation region is needed on the drain side of the gate. In yet other embodiments, a butted first S/D region and well contact is provided in the source side and no body well or internal isolation region are provided in the drain side. This further facilitates a more compact transistor. For example, no internal isolation region is needed and a butted source region and well contact is provided.

Contact regions, such as S/D regions, gate, and well contacts may include metal silicide contacts. For example, metal silicide, such as Ni-based silicide, may be disposed on the contact region. Metal silicide contacts reduce contact resistance, thereby improving performance.

In one embodiment, as shown, the source region is disposed adjacent to a first side of the gate and the drain region is displaced from the second side of the gate. The displacement, for example, may be about 0.3 µm. Other displacements may also be useful, depending on design requirements. The second side of the gate includes a dielectric silicide block 138. The silicide block, for example, may be a patterned dielectric layer, such as silicon oxide. Other types of silicide blocks, such as silicon nitride may also be useful. The silicide block is patterned to cover a portion of the second side of the gate and substrate adjacent to the second side of the gate. For example, the silicide block covers a portion of the top of the gate on the second side, second gate sidewall and a portion of the substrate adjacent to the second gate sidewall. The silicide block prevents formation of the metal silicide contact on the substrate adjacent to the second gate sidewall.

In one embodiment, a drift well 144 is disposed in the device well. The drift well is located on a second side of the gate. The drift well, in one embodiment, is a first polarity type doped well. The drift well may be an intermediately doped drift well. For example, the dopant concentration of the drift well may be about 1E11-1E13 atoms/cm$^3$. Other dopant concentrations may also be useful. The drift well may be formed either before or after gate formation. For example, the drift well may be formed by a drift well implant prior to forming the gate using a drift well implant mask. In the case of forming the drift well after gate formation, the implant may be a self-aligned implant to the gate.

In one embodiment, the drift well extends from the surface of the substrate to a depth which is shallower than the bottom of the trench isolation regions and bottom of the device well but deeper than the drain region. For example, the source region is disposed in the device well and the drain region is disposed within the drift well. The depth of the drift well may be about 0.2-0.3 µm. Providing a drift well having other depths may also be useful. For example, the drift well may have a depth deeper than the bottom of trench isolation regions but shallower than the bottom of the device well and the buried layer.

The drift well extends from the internal trench isolation region and underlaps the second side of the gate. The distance between the source region and drift well defines a channel length of the transistor. In one embodiment, the drift well underlaps about half of the gate. Underlapping the gate by other distances may also be useful. The amount of underlap may depend on the desired channel length. As shown, the depth of the drift well is shallower than the bottom of the internal trench isolation region. For example, the drift well may extend to a depth which is less than 0.3 µm. The depth of the drift well may be about 0.2-0.3 µm. Providing a drift well having other depths may also be useful.

In one embodiment, a band region 150 is disposed below the drift well. As shown, the band region is disposed under the drift well and extends to the buried isolation layer. For example, the band region occupies a lower portion of the substrate in the isolated device region below the drift well to the buried isolation layer. The band region, in one embodiment, is intermediately doped with first polarity type dopants. For example, the band region is a p band for an n-type device. The dopant concentration of the band region may be about 1E11-1E13 atoms/cm$^3$. Other dopant concentrations may also be useful. The band region and the device well fully isolate the drift well.

In one embodiment, the band region is a self-aligned band region which is self-aligned to the drift well. For example, the same implant mask used for the drift well is used for the band region. However, different polarity type dopants and implant energies are used. For example, p-type dopants are implanted using higher implant energy to form the p band region below the n-type drift well. The band region and the device well completely surround the drift well.

As shown in FIG. 1a, the self-aligned band region 150 includes an inner band region edge along the channel width direction under the gate. The inner band region edge is aligned to the inner drift well edge of the drift well along the channel width direction. As for the outer edge along the length direction, it is disposed under the internal isolation region. The edges in the channel width direction are disposed under the device isolation region. Other configurations of the band region may also be useful. For example, the inner edge of the band region may not be aligned to the drift well.

In another embodiment, as shown in FIG. 1b, the self-aligned band region 151, similar to FIG. 1a, is disposed below the drift well and extends to the buried isolation layer. However, the inner edge of the band region along the channel width direction extends farther under the gate than the drift well. Furthermore, the band region portion which extends beyond the drift well and farther under the gate than the inner drift well edge (extended band region portion) has a height which is above the bottom of the drift well. In one embodiment, the height of the extended band region portion extends almost to the surface of the substrate. For example, the height of the extended band region portion extends to about 500 Å below the surface of the substrate. Providing extended band region portions having other heights or distances from the surface of the substrate may also be useful. In some cases, the extended band region may extend to the surface of the substrate. For example, thermal processing, which may be part of the normal process for forming the device, may cause dopants of the extended band region to diffuse to the substrate surface. The thermal processing may be part of the normal processing, such as dopant activation or specifically diffusing the dopants of the extended band region dopants to the surface of the substrate.

The extended band region portion creates a halo region surrounding the drift well. For example, the height of the extended band region portion should be sufficient to create a halo region surrounding the drift well. The halo region can further fine-tune the device threshold voltage ($V_t$) to reduce leakage and improve coupling field/strength performance. In addition, the outer edge along the channel width direction may extend farther under the internal isolation region than the band region of FIG. 1a. Similarly, the edges in the channel width direction extend farther under the device isolation region. The differences in the self-aligned band regions are due to the use of a quad implant at a tilt angle versus a vertical implant. The quad implant may be performed with a tilt angle of about 15°-40°. Other tilt angles for the quad implant may also be useful. The amount which the band region portion extends beyond the drift well and the height may vary depending on the tilt angle of the implant. Other configurations of the band region may also be useful.

The doping of the band region can be tailored to improve device performance. For example, the doping may depend on performance requirements of the device. As such, the doping of the device well and band region can be different. The band region enables a reduction in the depth of the drift well, such as less than 0.3 μm. Reducing the depth of the drift well advantageously reduces the risk of punch-though. In addition, this facilitates reducing the channel size, resulting in a reduced gate charge $Q_{gg}$. The use of a shallower drift well and band region diffusion to further compensate for drift well dosage reduces drift/body junction area, resulting in a reduced drain to body parasitic capacitance $C_{bd}$. This improves the switching speed of the transistor. Furthermore, the use of a shallower drain junction can increase margin for the buried isolation layer depth, which improves the vertical parasitic bipolar junction transistor (BJT) impact.

Figure 1C:
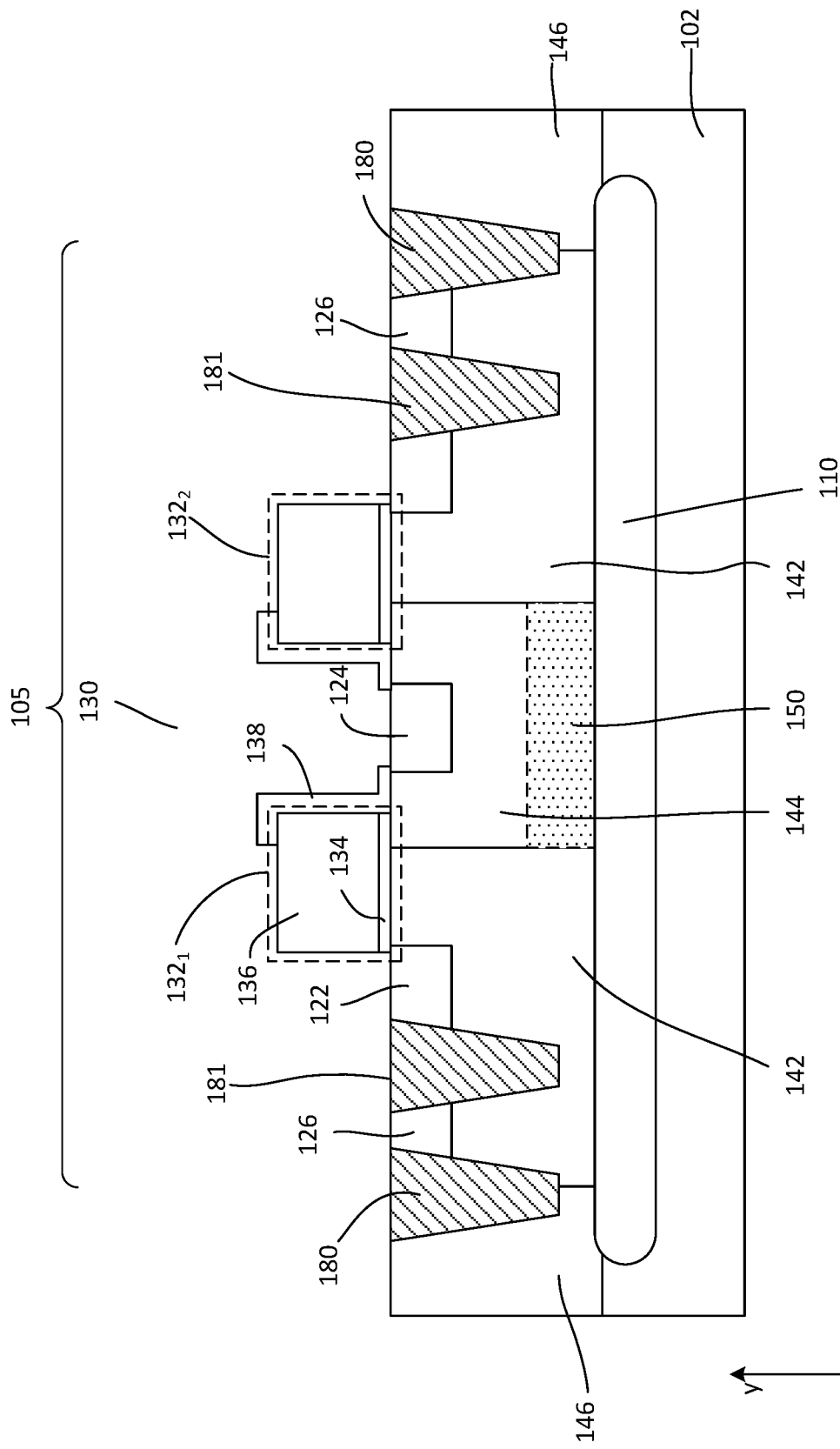
FIGS. 1c-1d show simplified cross-sectional views of other embodiments of a device.
Figure 1D:
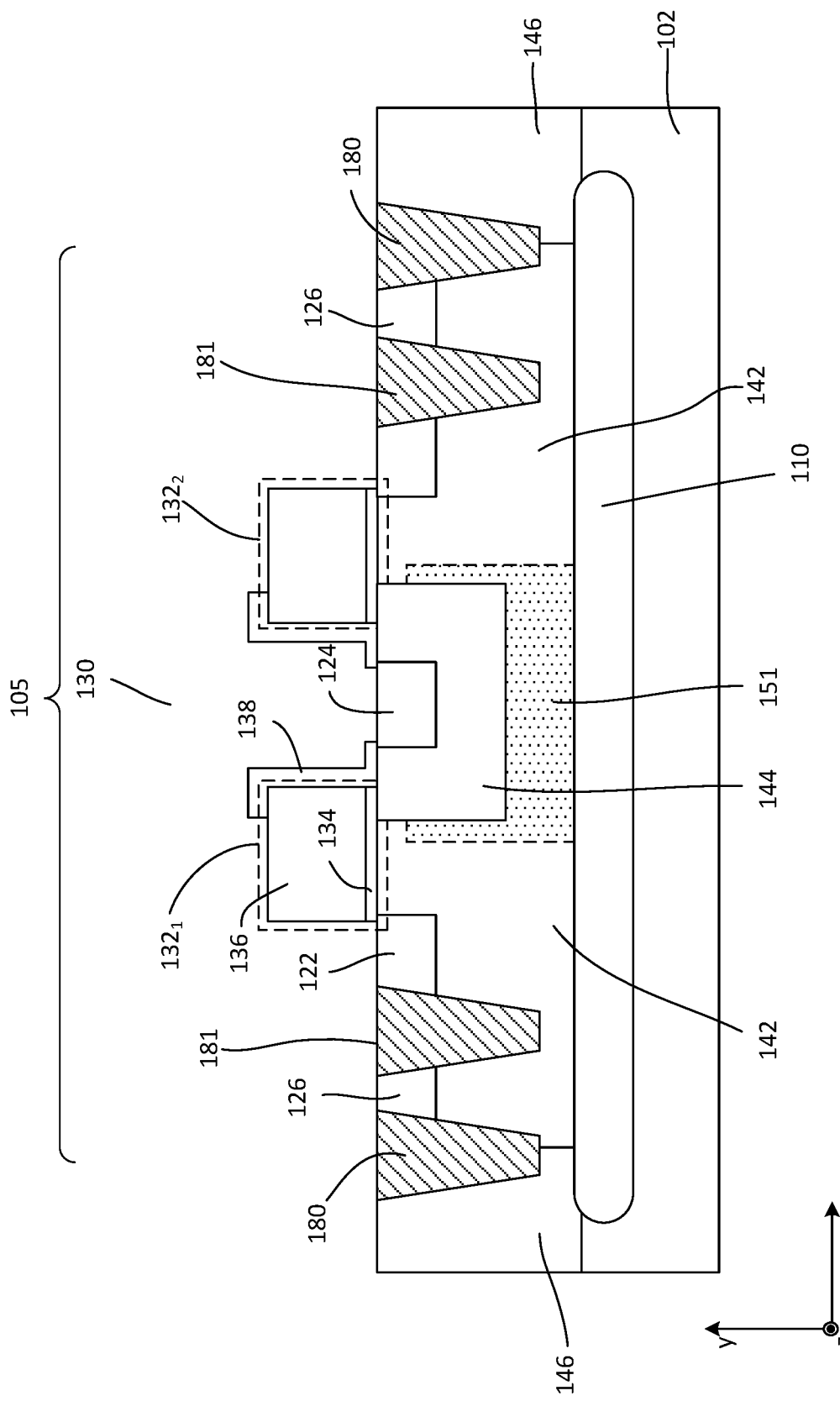

As shown in FIGS. 1a-1b, devices 100 with transistors 130 having a single finger or gate are described. Transistors with multiple fingers or gates may also be useful. FIGS. 1c-1d show embodiments of a device 101 with a transistor 130 having two fingers or gates. The devices of FIGS. 1c-1d, for example, are similar to that described in FIGS. 1a-1b. Common elements may not be described or described in detail.

Referring to FIG. 1c, the transistor includes first and second gates $132_{1-2}$ disposed on the substrate in the device region. Adjacent sidewalls of the gates are second sidewalls, each with a silicide block 138 displacing a common second S/D or drain region 124. As for the first gate sidewalls, they are opposite to the adjacent second gate sidewalls. The first gate sidewalls may include sidewall spacers (not shown). The first gate sidewall spacers, for example, facilitate forming LD extension regions and slightly displace the heavily doped first S/D or source regions 122. For example, LD extension regions are formed prior to forming the gate sidewall spacers while the source regions are formed after forming the sidewall spacers.

As shown, the device region is surrounded by a device isolation region 180. An internal isolation region 181 is disposed within the device isolation region. The isolation regions are separated by a guard ring region. For example, the device isolation region and internal isolation region are concentric isolation regions separated by the guard ring region. A device or body well 142 is disposed in the substrate in the device region. The body well, as shown, includes first and second sides disposed within the device isolation region. A side of the body well encompasses a source region and extends under a portion of the gate or finger. For example, a first side of the body well encompasses a source region adjacent to the first sidewall of the first finger and extends thereunder; the second side of the body well encompasses a source region adjacent to the first sidewall of the second finger and extends thereunder. A well contact 126 may be disposed in the guard ring region between the device and internal isolation regions. A depth of the body well extends below the bottom of the isolation regions.

In one embodiment, the device is an isolated device. For example, a doped device isolation well is provided in the substrate, surrounding or encompassing the device well. The device isolation well isolates the device well from the substrate. In one embodiment, the device isolation well includes side device isolation and deep device isolation wells 146 and 110. The side device isolation and deep device isolation wells encompass the device well, isolating it from the substrate. For example, the side device isolation well surrounds the device isolation region and extends at least the same depth as the device well. As for the deep device isolation well, it is disposed below the device well and extends under the side device isolation well. The deep device isolation well, for example, may be a buried isolation layer. The side device isolation well and buried isolation layer encompass the device well and the device trench isolation region, fully isolating the device region from the substrate and other device regions.

Disposed between the inner edges of the first and second sides of the body well is a drift well 144. The drift well encompasses the second or drain region 124. The drift well extends from the surface of the substrate to a depth less than the buried isolation layer 110. In one embodiment, opposing drift well edges are along a channel width direction of the device region. As shown, the depth of the drift well is shallower than the bottom of the internal trench isolation region. The drift well extends under the first and second gates and abuts the body well.

In one embodiment, a band region 150 is disposed below the drift well. As shown, the band region is disposed under the drift well and extends to the buried isolation layer. For example, the band region occupies a lower portion of the substrate in the isolated device region below the drift well to the buried isolation layer. In one embodiment, the band region is a self-aligned band region which is self-aligned to the drift well. For example, the same implant mask used for the drift well is also used for the band region. However, different polarity type dopants and implant energies are used. For example, p-type dopants are implanted using higher implant energy to form the p band region below the n-type drift well. The device well and band region surround the drift well. As shown, the self-aligned band region 150 has first and second opposing edges along the channel width direction under the gate which are aligned to first and second opposing edges of the drift well, opposing the drift well edges. Other configurations of the band region may also be useful.

In another embodiment, as shown in FIG. 1d, the self-aligned band region 151, similar to FIG. 1c, is disposed below the drift well and extends to the buried isolation layer. However, the first and second opposing edges of the band region along the channel width direction extend farther under the gate than the drift well. Furthermore, the portions which extend beyond the drift well (extended band region portions) have a height which extends almost to the surface of the substrate. For example, the height of the extended band region portions may be about 500 Å below the surface of the substrate. Providing extending band region portions having other heights or distances below the substrate surface may also be useful. This creates a halo region surrounding the drift well. In one embodiment, the halo region may extend to the surface of the substrate. The halo region can further fine-tune the device threshold voltage ($V_t$) to reduce leakage and improve coupling field/strength performance. In addition, the outer edge along the channel width direction may extend farther under the internal isolation region than the band region of FIG. 1c. The differences in the self-aligned band regions are due to the use of a quad implant at a tilt angle versus a vertical implant. The quad implant may be performed with a tilt angle of about 15°-40°. Other tilt angles for the quad implant may also be useful. The amount which the band region portion extends beyond the drift well and the height may vary depending on the tilt angle of the implant. Other configurations of the band region may also be useful.

The doping of the band region can be tailored to improve device performance. For example, the doping may depend on performance requirements of the device. As such, the doping of the device well and band region can be different. The band region enables a reduction in the depth of the drift well, such as less than 0.3 μm. Reducing the depth of the drift well advantageously reduces the risk of punch-though. In addition, this facilitates reducing the channel size, resulting in a reduced gate charge $Q_{gg}$. The use of a shallower drift well and band region diffusion to further compensate for drift well dosage reduces drift/body junction area, resulting in a reduced drain to body parasitic capacitance $C_{bd}$. This improves the switching speed of the transistor. Furthermore, the use of a shallower drain junction can increase margin for the buried isolation layer depth, which improves the vertical parasitic bipolar junction transistor (BJT) impact.

Figure 2A:
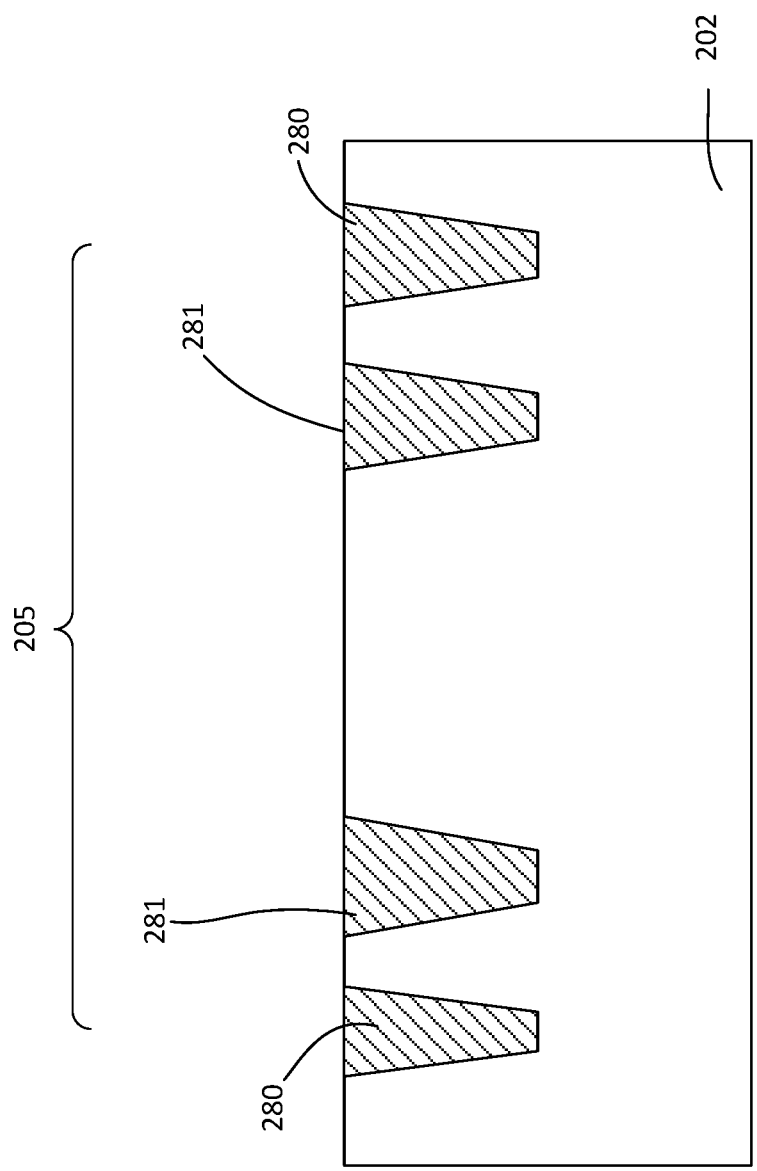
FIGS. 2a-2e show cross-sectional views of a process for forming a device.

FIGS. 2a-2e show cross-sectional views of an embodiment of a process 200 for forming a device. Referring to FIG. 2a, a substrate 202 is provided. The substrate, in one embodiment, is a silicon substrate. The substrate may be a lightly p-doped silicon substrate. Other types of substrates may also be useful. The substrate is prepared with a device region 205. The device region, for example, is a high voltage (HV) device region for a HV device, such as a HV transistor. In one embodiment, the device region is for a LDMOS transistor. The device region may be a rectangular shaped device region. Other geometrically shaped device regions may also be useful. The substrate may also include other device regions for other types of circuit components, depending on the type of device or IC. For example, the substrate may also include regions for intermediate voltage (IV) and low voltage (LV) devices, as well as an array region for memory devices.

The device region is prepared with trench isolation regions, such as shallow trench isolation (STI) regions. Other types of isolation regions may also be useful. In one embodiment, the device region is prepared with device STI and internal STI regions 280 and 281. The device STI region surrounds the device region while internal STI regions partition the device region into sub-regions. In one embodiment, the internal STI region is disposed within and surrounded by the device STI region, resulting in a guard ring region therebetween. Other configurations of device and internal STI regions may also be useful. Various processes can be employed to form the STI regions. For example, the substrate can be etched using etch and mask techniques to form isolation trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 3000 Å. Other depths for the STIs may also be useful.

Figure 2B:
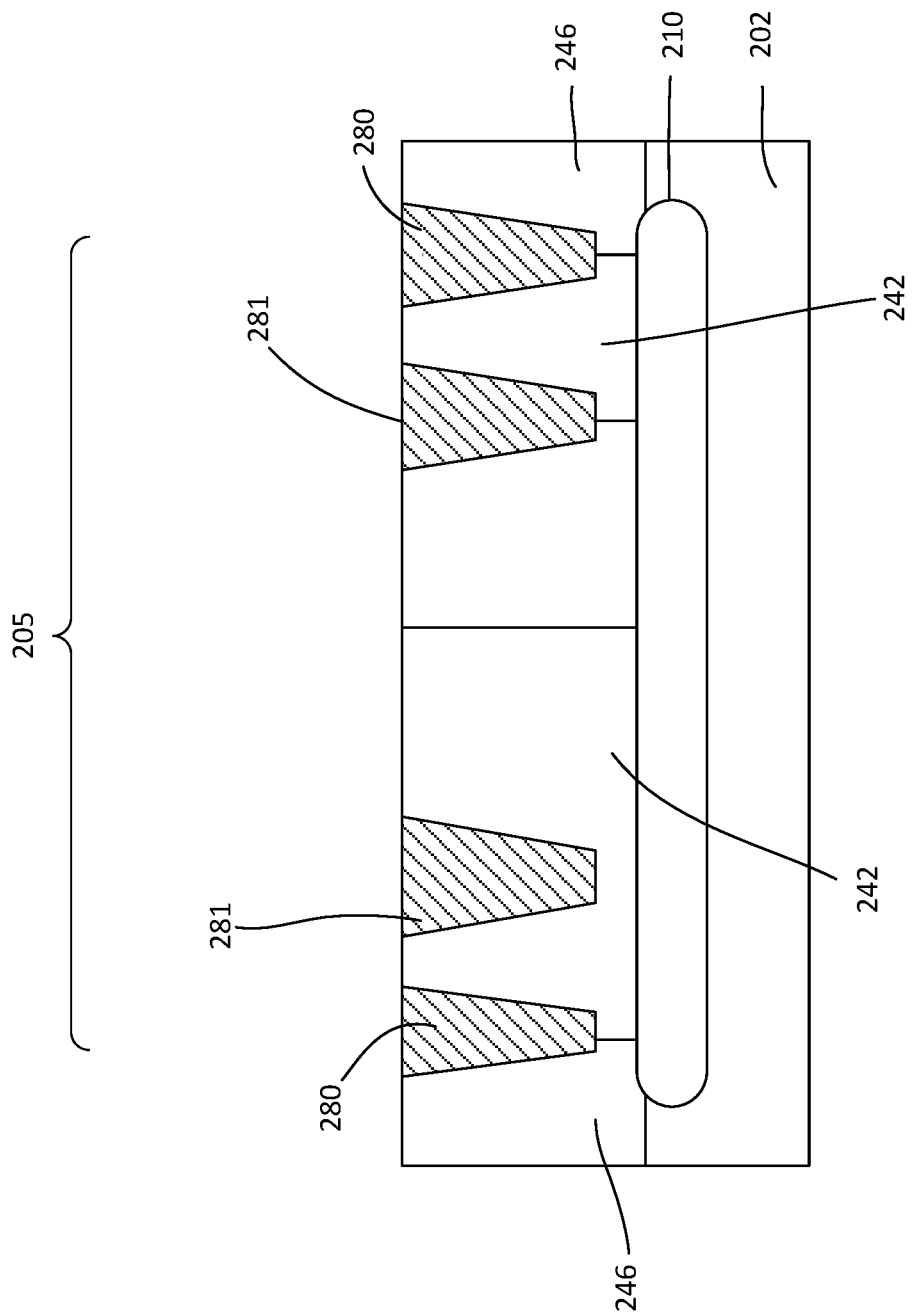

Referring to FIG. 2b, wells are formed in the substrate. In one embodiment, after trench isolation regions are formed, various wells of the device region are formed. For example, side and deep device isolation wells 246 and 210 are formed in the substrate. The side and deep device isolation wells are first polarity type isolation wells. The dopant concentration of the wells may be about 1E11-1E13 atoms/cm³. Other dopant concentrations may also be useful.

In one embodiment, the deep device isolation well 210 is formed by a deep device isolation implant using a deep isolation implant mask, such as a patterned resist mask. The resist, for example, may be patterned by exposing it with an exposure source using a reticle having the desired pattern. After exposure, the resist is developed, transferring the pattern of the reticle to the resist. An implant is performed using the patterned implant mask to form the deep device isolation well. The implant forms the deep device isolation well. The deep device isolation well may be disposed from a range of about 1.0 μm to 3.0 μm below the substrate surface. For example, the deep device isolation well may have a top located at about 1.0 μm below the substrate surface and a bottom at a depth of about 1.5 μm. Providing other depths for the deep device isolation well may also be useful. The deep device isolation well may be referred to as a buried layer or buried isolation layer. The deep device isolation well extends, for example, outside the device trench isolation region.

As for the side device isolation well 246, it surrounds device trench isolation region. The side device isolation well extends from the surface of the substrate to below the top surface of the deep device isolation well. This ensures that the device region within the side device isolation and deep device isolation wells is isolated from the substrate. The side device isolation well may be formed by a side device isolation implant using a side device isolation implant mask, similar to that described for forming the deep device isolation well.

A device or body well 242 is also formed in the device region. The device well, for example, is formed within the side isolation well 246 and buried isolation layer 210. As shown, the device well abuts the side isolation well and the deep isolation layer. For example, the device well may have a depth of about 1 μm. Other depths may also be useful. The device well, in one embodiment, is a second polarity type device well. The second polarity type device well is for a first polarity type transistor. For example, the p-type device well is for a n-type transistor. Providing a n-type device well for a p-type transistor may also be useful. The dopant concentration of the device well, for example, may be about 1E11-1E13 atoms/cm³. Other dopant concentrations may also be useful.

To form the device or body well, dopants are implanted into the device region using a device well implant mask. The implant mask exposes the device region except for the drain side. For example, the implant mask protects the drain side of the device region within the internal device trench isolation region, leaving the source side and guard ring region exposed. Alternatively, the implant mask may protect the drain side of the device region, leaving the source side and the guard ring region exposed. Other configurations of the implant mask may also be useful.

Figure 2C:
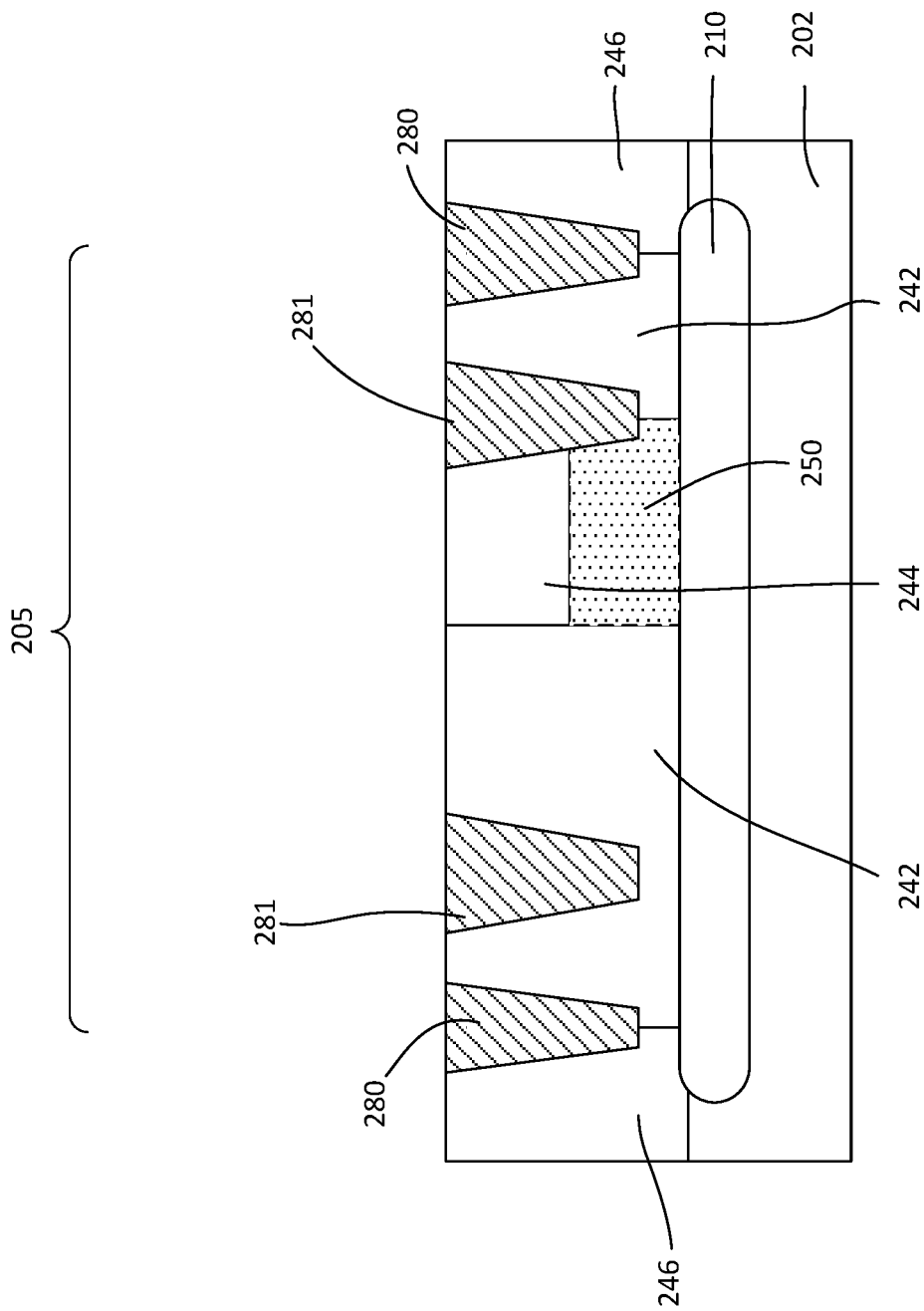

Referring to FIG. 2c, in one embodiment, a drift well 244 and a band region 250 are formed. The drift well is a first polarity type drift well. The dopant concentration of the drift well may be about 1E11-1E13 atoms/cm$^3$. Other dopant concentrations may also be useful. In one embodiment, the drift well has a depth which is shallower than the bottom of the device isolation regions and/or internal isolation regions. For example, the drift well has a depth which is less than 0.3 μm. The depth of the drift well may be about 0.2-0.3 μm. Other depths may also be useful. The drift well may be formed by implanting first polarity type dopants into the substrate using a drift well implant mask. The drift well implant mask, for example, exposes the drain side of the device region. For example, the implant mask exposes the drain side of the device region within the internal trench isolation region, leaving the source side and guard ring region protected. Alternatively, the implant mask may expose the drain side of the device region, leaving the source side and guard ring region protected. Other configurations of the implant mask may also be useful.

The band region is formed beneath the drift well. For example, the band region extends from a bottom of the drift well to the top of the buried isolation layer. The band region, in one embodiment, is a second polarity type band region. The dopant concentration of the band region may be about 1E11-1E13 atoms/cm$^3$. Other dopant concentrations may also be useful. The band region is formed by implanting the second polarity type dopants using the drift well implant mask. For example, the band region is a self-aligned band region which is self-aligned to the drift well. As shown, the implant to form the band region is a vertical implant. As such, the implant forms a band region in which the inner edge under the gate is aligned with an inner edge of the drift well while an outer edge of the band region is disposed under the internal trench isolation region. Other configurations of the self-aligned band region and drift well may also be useful. The sequence of forming the drift well and band region can be interchanged. For example, the drift well may be formed prior or after forming the band region. In other embodiments, the drift well and band region may be formed later on in the process flow, such as after gate formation.

Figure 2D:
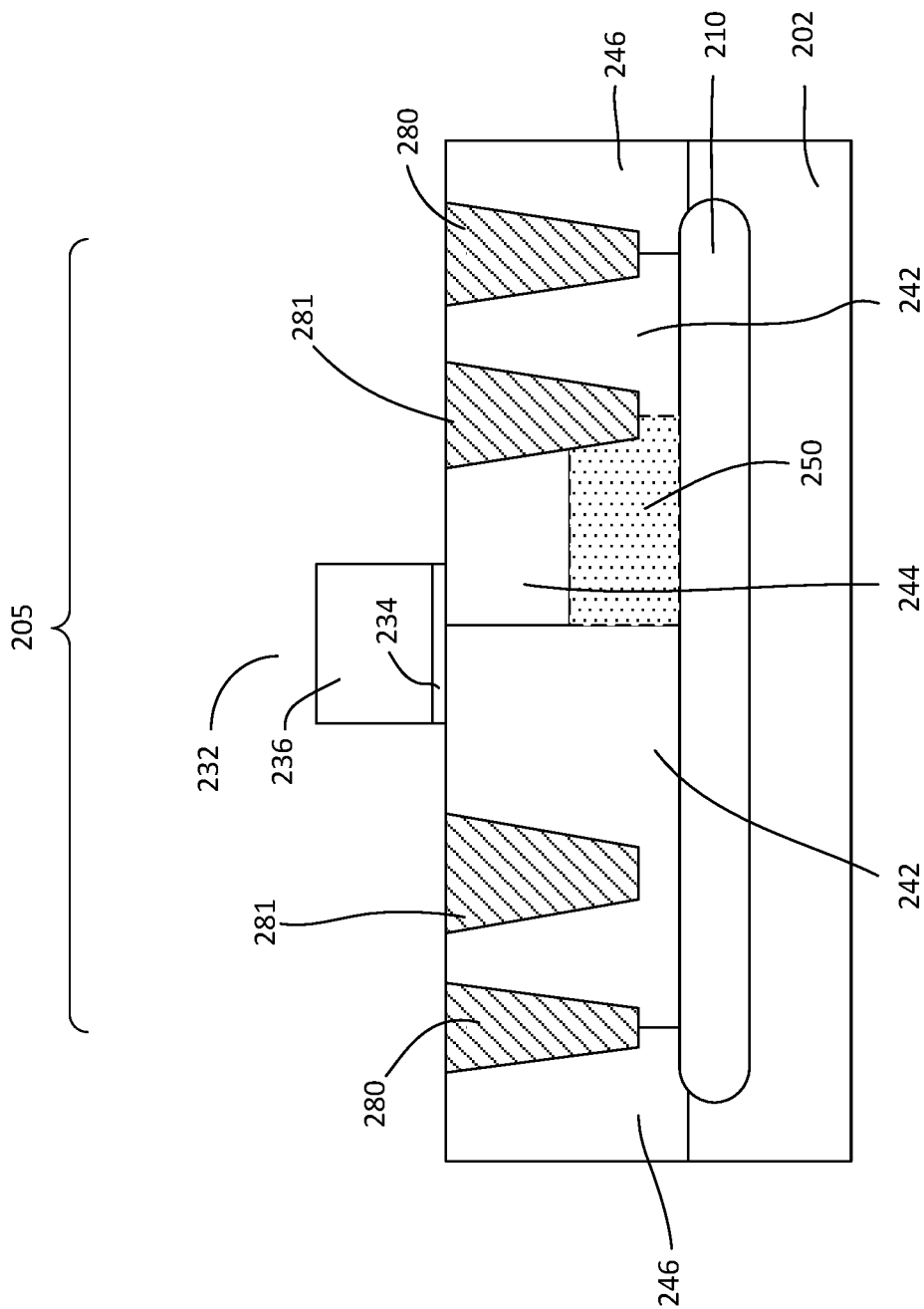

The process continues to form a gate 232, as shown in FIG. 2d. To form the gate, gate layers are formed on the substrate. The gate layers include a gate dielectric layer and a gate electrode layer. The gate dielectric layer may be a silicon oxide layer formed by thermal oxidation. As for the gate electrode layer, it may be a polysilicon layer formed by chemical vapor deposition (CVD). The gate electrode layer may be a doped gate electrode layer. For example, the gate electrode layer may be doped with first polarity type dopants by in-situ doping or ion implantation. Other types of gate layers as well as forming techniques may also be useful.

The gate layers are patterned to form the gate. For example, the gate includes a gate dielectric 234 under a gate electrode 236. Patterning the gate layers may be achieved by mask and etch techniques. For example, a patterned mask, such as a photoresist mask, is employed for an anisotropic etch, such as a reactive ion etch (RIE). The etch removes gate layers exposed by the mask, forming the gate.

Figure 2E:
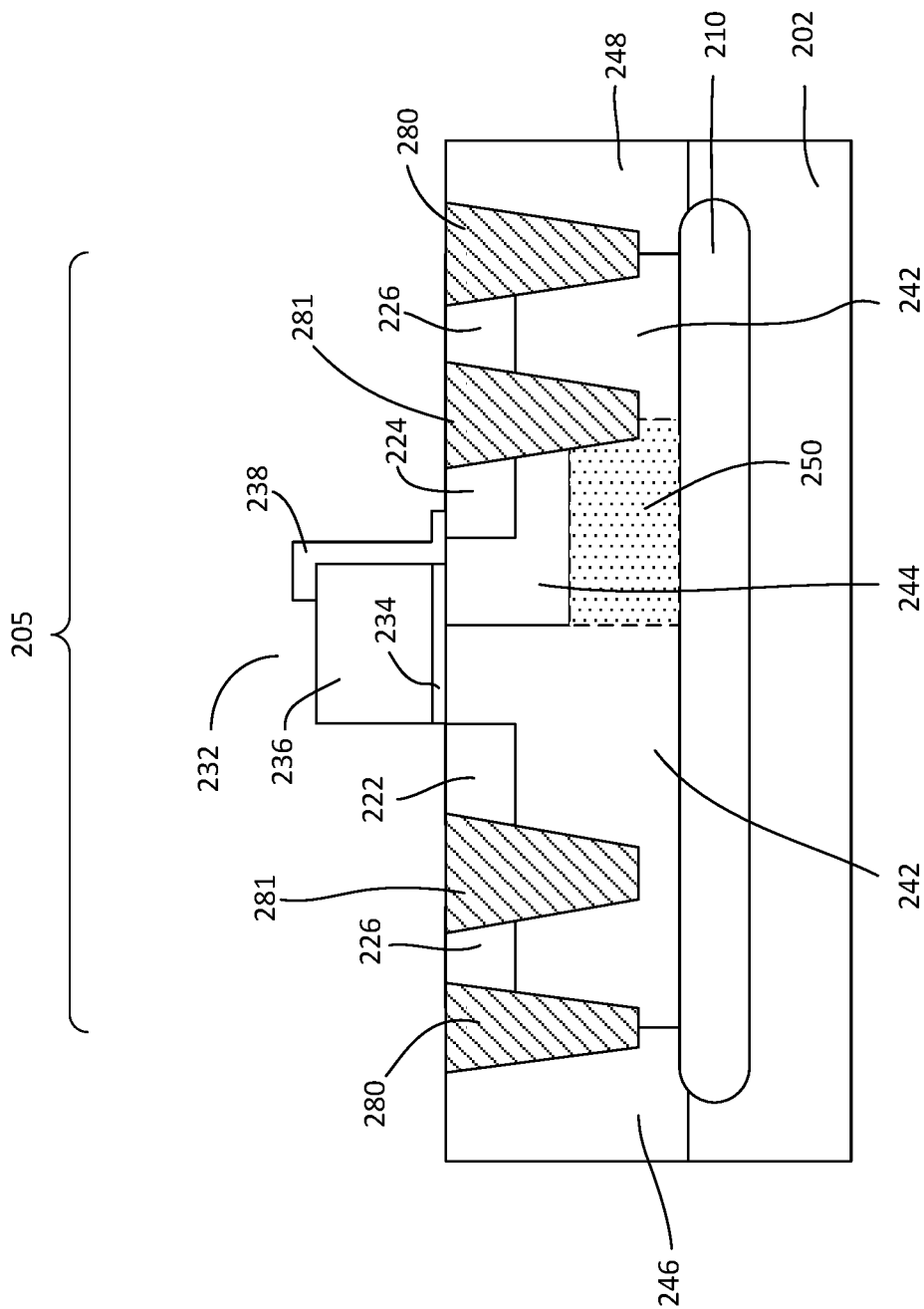

Referring to FIG. 2e, after forming the gate, the exposed polysilicon electrode is re-oxidized to form a thin oxide layer. A LD extension region (not shown) may be formed in the source region of the transistor. The LD extension region, for example, is a lightly doped first polarity region. To form the LD extension region, an implant mask exposing the first S/D or source region is used for a lightly doped first polarity type implant. The implant implants first polarity type dopants to form the LD extension region in the source region. The LD extension region, for example, is aligned with the first sidewall of the gate. The LD extension region may extend slightly under the gate.

In some cases, the drift well and band region may be formed after gate formation. The drift well and band region are formed using, for example, a drift implant mask which exposes a drain side of the device region. The implant, for example, is self-aligned to the gate at the drain side. The implant may be an extension implant at the drain side to form the drift well. Both the drift well and band region are formed using the same implant mask, but implanting different types of dopants using separate implant processes. The sequence of forming the drift well and band region can be interchanged.

Dielectric sidewall spacers (not shown) may be formed on sidewalls of the gate. To form the spacers, a dielectric layer is formed on the substrate, such as by CVD. An anisotropic etch, such as RIE, may be performed to remove horizontal portions of the dielectric layer, leaving the dielectric sidewall spacers on the gate sidewalls. Other techniques for forming the spacers may also be useful.

First and second S/D regions 222 and 224 are formed in the substrate. The first S/D region is adjacent to the source side of the gate and the second S/D region is adjacent to the drain side of the gate. For example, source and drain regions are formed. As shown, the drain is displaced from the second sidewall of the gate. The first and second S/D regions are heavily doped first polarity type S/D regions. To form the first and second S/D regions, a first polarity type S/D implant using a first polarity type S/D implant mask is performed. The S/D regions extend from a surface of the substrate to a depth of about 150 Å. Other depths may also be useful. The first S/D or source region may be aligned to the sidewall spacer (not shown), with the LD extension extending under the gate. As for the second S/D or drain region, it is displaced from the second sidewall of the gate.

Device body well contacts 226 may also be formed in the device region. The device body well contacts may be heavily doped second polarity type regions disposed between the internal device trench isolation regions and the device isolation regions. The device well contacts may be formed with a second polarity type S/D implant using a second polarity type S/D implant mask. The device body well contacts may also include second polarity type LD regions corresponding to LD extension regions.

The process continues to form a silicide block 238 on the drain side of the gate. The silicide block, for example, is a dielectric silicide block. In one embodiment, the silicide block may be a silicon nitride silicide block. Other types of dielectric materials, such as silicon oxide, may also be used for the silicide block. To form the silicide block, a dielectric block layer is formed on the substrate. The dielectric block layer, for example, may be formed by CVD. Forming the dielectric block using other forming or deposition techniques may also be useful. The thickness of the block layer may be about 250 Å. Other thicknesses may also be useful. The block layer is patterned by mask and etch techniques to form the silicide block. For example, a patterned resist mask is formed and patterned. An etch, such as RIE, may pattern the block layer using the mask, forming the silicide block.

Metal silicide contacts (not shown) may be formed. For example, metal silicide contacts may be formed on contact regions of the transistor after formation of the silicide block.

For example, metal silicide contacts may be formed on well contacts, S/D regions, and the gate electrode. The metal silicide contacts may be Ni-based silicide contacts. To form metal silicide contacts, a metal layer is formed over the substrate and annealed to cause a reaction with the metal and the exposed silicon surfaces. The reaction forms metal silicides. Excess unreacted metal is removed by, for example, a wet etch.

The process may continue to form the device. For example, back-end-of-line (BEOL) processes may be performed to form BEOL dielectric with a plurality of ILD levels, as previously discussed, to form interconnections to the terminals of the memory cell. Additional processes are performed to complete the IC. These processes include, for example, final passivation, dicing, and packaging. Other processes may also be included.

Figure 3:
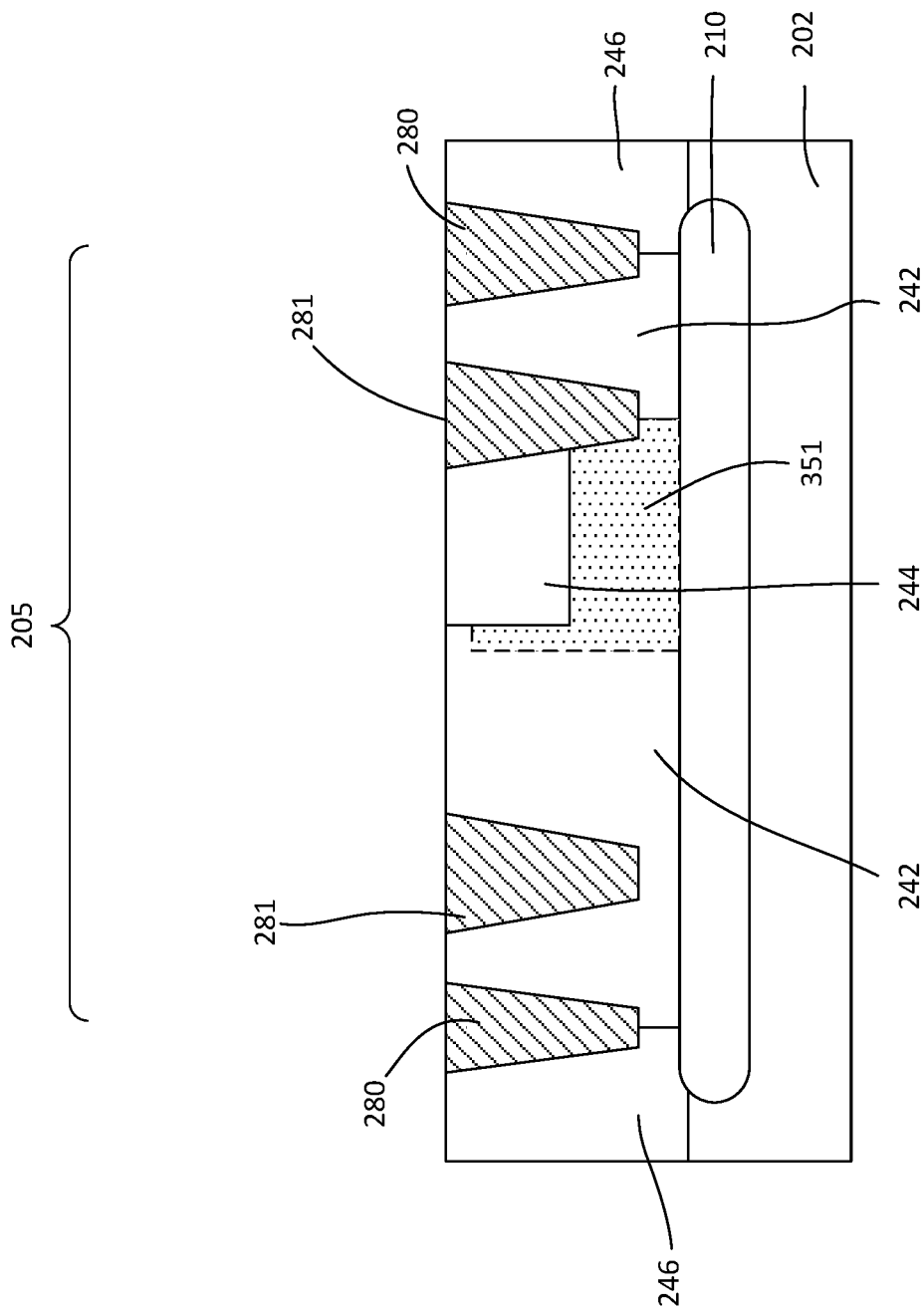
FIG. 3 shows a cross-sectional view of an alternative process for forming a device.

FIG. 3 shows a cross-sectional view of an alternative process 300 for forming a device. As shown, the stage of processing is similar to that described in FIG. 2c. Common elements may not be described or described in detail. As shown, a substrate 202 is prepared with a device well 242 isolated from the substrate by a side device isolation well 246 and a deep device isolation layer 210. The process also forms a drift well 244 and a band region 351. The drift well and band region, for example, are both formed by the same mask. In other words, the band region may be a self-aligned band region. As also discussed, the sequence of forming the drift well and band region can be interchanged.

In one embodiment, the band region is formed by a quad implant using the same mask as the drift well. The quad implant forms a band region in which an inner edge along the channel width direction extends farther under the gate than the drift well. Furthermore, the portion which extends beyond the drift well has a height which extends almost to the surface of the substrate. In addition, the outer edge along the channel width direction may extend farther under the internal isolation region than the band region of FIG. 2c. Similarly, the edges in the width direction extend farther under the device isolation region. The difference in the self-aligned band region is due to the use of a quad implant at a tilt angle versus a vertical implant. The quad implant may be performed with a tilt angle of about 15°-40°. Other tilt angles for the quad implant may also be useful. The amount which the band region portion extends beyond the drift well and the height may vary depending on the tilt angle of the implant. Other configurations of the band region may also be useful. The process continues as described with respect to FIGS. 2d-2e.

In other embodiments, the drift well and band region are formed later on in the process flow. For example, the drift well and band region are formed after gate formation. The process of forming the drift well and band region is similar to that already described.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
   a substrate with a device region and a top surface;
   a gate disposed on the top surface of the substrate in the device region, the gate having a first gate sidewall and a second gate sidewall;
   a shallow trench isolation region in the device region, the shallow trench isolation region having a bottom with a first depth relative to the top surface;
   a first source/drain (S/D) region disposed adjacent to the first gate sidewall;
   a second source/drain (S/D) region disposed adjacent to the second gate sidewall, the second S/D region positioned in the device region between the shallow trench isolation region and the gate;
   a device well disposed in the substrate in the device region, the device well surrounding the first S/D region and extending partially under the gate from the first gate sidewall, and the device well having a bottom with a second depth relative to the top surface;
   a drift well disposed in the device region, the drift well surrounding the second S/D region and extending under the gate, the drift well abutting the device well, the drift well having a bottom with a third depth relative to the top surface, the third depth is shallower than the second depth, and the third depth is shallower than the first depth; and
   a band region disposed below the drift well, the band region including a bottom with a fourth depth relative to the top surface, and the fourth depth is about equal to the second depth.

2. The device of claim 1, wherein:
   the device well and the band region include second polarity type dopants; and
   the first S/D region, the second S/D region, and the drift well include first polarity type dopants that are different from the second polarity type dopants.

3. The device of claim 1, wherein the device well includes second polarity type dopants, and further comprising:
   a device isolation well disposed in the substrate, the device isolation well surrounding the device well, the device isolation well including first polarity type dopants to isolate the device well from the substrate,
   wherein the second polarity type dopants are different from the first polarity type dopants.

4. The device of claim 3 wherein the device isolation well comprises:
   a side isolation well surrounding sides of the device well; and
   a buried isolation layer abutting a bottom of the device well and extending under the side isolation well.

5. The device of claim 1, further comprising:
   a well contact coupled to the device well,
   wherein the well contact and the first S/D region are butted.

6. The device of claim 1 wherein the second S/D region is displaced laterally from the second gate sidewall.

7. The device of claim 1, further comprising:
   a silicide block disposed on the second gate sidewall, a portion of the gate adjacent to the second gate sidewall, and a portion of the substrate adjacent to the second gate sidewall.

8. The device of claim 1, wherein the drift well includes an inner drift well edge along a channel width direction of the device region, and the band region comprises an inner band region edge along the channel width direction that is aligned with the inner drift well edge of the drift well.

9. A device comprising:
   a substrate with a device region and a top surface;

a gate disposed on the top surface of the substrate in the device region, the gate having a first gate sidewall and a second gate sidewall;

a first source/drain (S/D) region disposed adjacent to the first gate sidewall;

a second source/drain (S/D) region disposed adjacent to the second gate sidewall;

a device well disposed in the substrate in the device region, the device well surrounding the first S/D region and extending partially under the gate from the first gate sidewall, and the device well having a bottom with a device well depth relative to the top surface;

a drift well disposed in the device region, the drift well surrounding the second S/D region and extending under the gate, the drift well abutting the device well, the drift well having a bottom with a drift well depth relative to the top surface, and the drift well depth is shallower than the device well depth; and a band region disposed below the drift well, the band region including a bottom with a band region depth relative to the top surface, and the band region depth is about equal to the device well depth, wherein the drift well has an inner drift well edge, the band region includes an inner band region edge along a channel width direction of the device region, the inner band region edge extends farther under the gate than the inner drift well edge of the drift well, a portion of the band region extends farther under the gate than the inner drift well edge, and the portion of the band region has a height that is above the bottom of the drift well.

10. The device of claim 9, wherein the portion of the band region serves as a halo region to fine tune a gate threshold voltage of the device.

11. A device comprising:

a substrate with a device region and a top surface;

a gate disposed on the top surface of the substrate in the device region, the gate having a first gate sidewall and a second gate sidewall;

a first source/drain (S/D) region disposed adjacent to the first gate sidewall;

a second source/drain (S/D) region disposed adjacent to the second gate sidewall;

a device well disposed in the substrate in the device region, the device well surrounding the first S/D region and extending partially under the gate from the first gate sidewall, and the device well having a bottom with a device well depth relative to the top surface;

a drift well disposed in the device region, the drift well surrounding the second S/D region and extending under the gate, the drift well abutting the device well, the drift well having a bottom with a drift well depth relative to the top surface, and the drift well depth is shallower than the device well depth; and a band region disposed below the drift well, the band region including a bottom with a band region depth relative to the top surface, and the band region depth is about equal to the device well depth, wherein:

the gate comprises first and second gates, second sidewalls of the first and second gates are adjacent sidewalls with the second S/D region serving as a common second S/D region for the first and second gates, the first S/D region comprises a third source/drain (S/D) region disposed adjacent to a first sidewall of the first gate, and a fourth source/drain (S/D) region disposed adjacent to a first sidewall of the second gate;

the drift well is disposed in the device region and surrounds the common second S/D region; and the band region is disposed below the drift well.

12. The device of claim 11, wherein:

the drift well comprises opposing drift well edges along a channel width direction of the device region; and the band region comprises opposing band region edges along the channel width direction that are aligned with the opposing drift well edges.

13. The device of claim 11, wherein:

the drift well comprises opposing drift well edges along a channel width direction of the device region, the band region comprises opposing band region edges along the channel width direction which extend farther under the first gate and the second gate than the opposing drift well edges, and portions of the opposing band region edges extend farther under the first gate and the second gate than the opposing drift well edges and extend almost to the top surface of the substrate.

* * * * *

UNITED STATES PATENT AND TRADEMARK OFFICE
CERTIFICATE OF CORRECTION

PATENT NO.        : 10,680,099 B2
APPLICATION NO.   : 15/898669
DATED             : June 9, 2020
INVENTOR(S)       : Liming Li Page 1 of 1

It is certified that error appears in the above-identified patent and that said Letters Patent is hereby corrected as shown below:

In the Claims

Column 14, Claim 8, Line 62, change "directionof" to --direction of--

Signed and Sealed this
Fourteenth Day of July, 2020

Andrei Iancu
*Director of the United States Patent and Trademark Office*